(12) United States Patent
Hsu et al.

(10) Patent No.: US 9,276,166 B2
(45) Date of Patent: Mar. 1, 2016

(54) METHOD FOR FORMING LIGHT-EMITTING DEVICE

(75) Inventors: Chia-Liang Hsu, Hsinchu (TW); Chih-Chiang Lu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 206 days.

(21) Appl. No.: 13/446,228

(22) Filed: Apr. 13, 2012

(65) Prior Publication Data

US 2013/0273673 A1    Oct. 17, 2013

(51) Int. Cl.
*G01R 31/26* (2014.01)
*H01L 21/66* (2006.01)
*H01L 33/00* (2010.01)
*H01L 27/15* (2006.01)

(52) U.S. Cl.
CPC ........ *H01L 33/0095* (2013.01); *G01R 31/2635* (2013.01); *H01L 27/156* (2013.01)

(58) Field of Classification Search
None
See application file for complete search history.

(56) References Cited

U.S. PATENT DOCUMENTS

| | | | | |
|---|---|---|---|---|
| 3,742,598 A | * | 7/1973 | Nishida | 438/7 |
| 6,750,152 B1 | * | 6/2004 | Christenson et al. | 438/735 |
| 2010/0155750 A1 | * | 6/2010 | Donofrio | 257/91 |
| 2011/0284884 A1 | * | 11/2011 | Lee et al. | 257/88 |
| 2012/0034714 A1 | * | 2/2012 | Tsai et al. | 438/16 |

\* cited by examiner

*Primary Examiner* — Evan Pert
*Assistant Examiner* — Shaka White
(74) *Attorney, Agent, or Firm* — Muncy, Geissler, Olds & Lowe, P.C.

(57) ABSTRACT

A method for forming a light-emitting device of the present application comprises providing a wafer; forming a first plurality of light-emitting elements on the wafer; providing a first connection structure to connect each of the first plurality of light-emitting elements; and applying a current flow to one of the first plurality of light-emitting elements for testing at least one electrical property of the light-emitting element while no current flow is applied to the remaining of the first plurality of light-emitting elements.

12 Claims, 12 Drawing Sheets

METHOD FOR FORMING LIGHT-EMITTING DEVICE

TECHNICAL FIELD

The application relates to a method for forming a light-emitting device.

DESCRIPTION OF BACKGROUND ART

The light-emitting diode (LED) is a solid state semiconductor device, which has been broadly used as a light-emitting device. The light-emitting device comprises a p-type semiconductor layer, an n-type semiconductor layer and an active layer. The active layer is formed between the p-type semiconductor layer and the n-type semiconductor layer. The light-emitting device generally comprises III-V group compound semiconductor such as gallium phosphide, gallium arsenide, or gallium nitride. The light-emitting principle of the LED is the transformation of electrical energy to optical energy by applying electrical current to the p-n junction to generate electrons and holes. Then, the LED emits light when the electrons and the holes combine.

When the LED is used for display apparatus or the like, typical usage conditions are approximately 1 V to 4 V for the drive voltage and approximately 20 mA for the drive current. With the recent development of the short-wavelength LEDs which uses a GaN-based compound semiconductor and commercialization of solid light sources of full color, white color, etc., application of the LEDs for illumination purposes has been considered. When the LED is used for illumination, there may be cases in which the LED is used under conditions other than the above-described conditions of 1 V-4 V of drive voltage and 20 mA of drive current. As a result, steps have been taken to enable a larger current to flow through the LED and to increase the light emission output. Generally, because of the requirements of light intensity and light efficiency of the LED, a high voltage LED is formed by electrically connecting two or more light-emitting elements.

During the fabrication processes of the high voltage LED, some manufacture deviations such as incoming materials, equipment malfunction or process excursion may happened, and that cause one or more light-emitting elements of the high voltage LED having different electrical bins.

Figure 1:
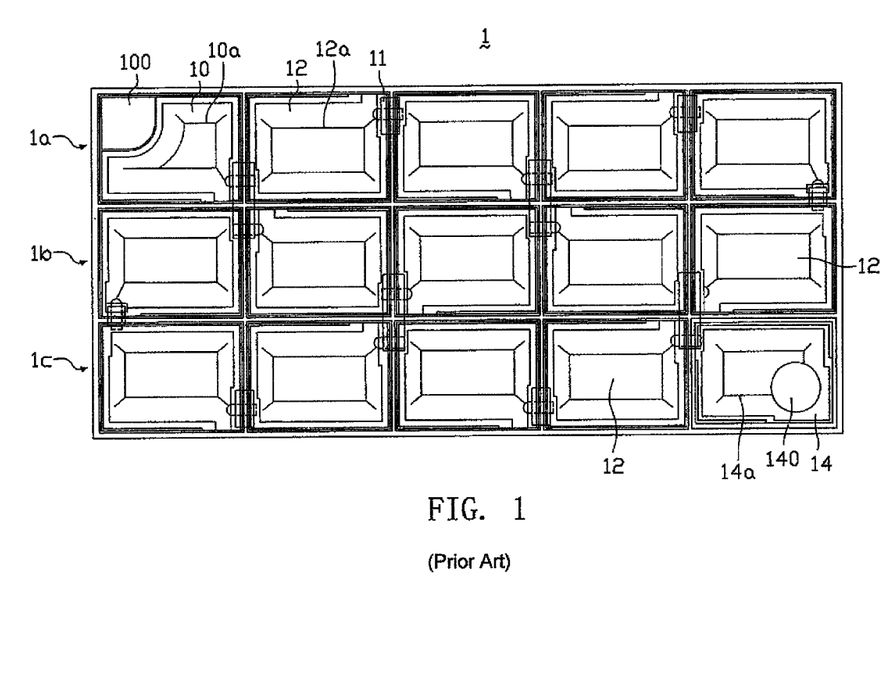
FIG. 1 illustrates a conventional high voltage light-emitting device.

FIG. 1 illustrates a conventional high voltage light-emitting device 1. The high voltage light-emitting device 1 comprises a plurality of light-emitting elements 10, 12, and 14 electrically connected with each other through a connection structure 11. As shown in FIG. 1, the high voltage light-emitting device 1 comprises fifteen light-emitting elements arranged in three columns 1a, 1b, and 1c. The first column 1a comprises one light-emitting element 10 and four light-emitting elements 12 connected in series in a first direction. The second column 1b comprises five light-emitting elements 12 connected in series in a second direction. The third column 1c comprises one light-emitting element 14 and four light-emitting elements 12 connected in series in the first direction. The first direction and the second direction are opposite. Each of the plurality of light-emitting elements 10, 12, and 14 comprises a semiconductor stack comprising an n-type semiconductor layer, a p-type semiconductor layer, and an active layer formed between the n-type semiconductor layer and the p-type semiconductor layer. The high voltage light-emitting device 1 further comprises a first electrode 100 formed on the light-emitting element 10 and a second electrode 140 formed on the light-emitting element 14. The first electrode 100 and the second electrode 140 are formed for wire bonding or flip chip type bonding. The polarities of the first electrode 100 and the second electrode 140 are different from each other. During the electrical test, the first electrode 100 and the second electrode 140 can correspond to a pair of external electrodes (not shown) such as probes. As shown in FIG. 1, the high voltage light-emitting device 1 further comprises an electrical finger structure 10a formed on the light-emitting element 10, an electrical finger structure 14a formed on the light-emitting element 14, and an electrical finger structure 12a formed on each of the plurality of light-emitting elements 12. The number of the light-emitting elements 12 formed between the light-emitting element 10 and the light-emitting element 14 is increased based on the desired quantity of light of the high voltage light-emitting device 1.

During the electrical test, a current from the probes is injected into the high voltage light-emitting device 1 through the first electrode 100 and the second electrode 140. The current injected from the first electrode 100 and the second electrode 140 spreads out in the light-emitting element 10 and the light-emitting element 14 through the electrical finger structures 10a and 14a respectively. The current further spreads between the plurality of light-emitting elements 12 via the electrical finger structure 12a and the connection structure 11.

In the conventional electrical test, a pair of probes contacts the first electrode 100 and the second electrode 140 correspondingly to test the electrical yield and electrical properties of the high voltage light-emitting device 1. The electrical properties can be reverse leakage current and forward voltage. Nevertheless, the conventional electrical test measurement can only get the overall electrical yield and electrical properties of the high voltage light-emitting device 1, and the electrical properties of each of the plurality of light-emitting elements 10, 12, and 14 are difficult to identify. If there is an electrical defect in one of the plurality of light-emitting elements 10, 12, and 14 during the fabrication processes, the electrical defect may degrade the reliability of the high voltage light-emitting device 1.

SUMMARY OF THE APPLICATION

One embodiment of the present application provides a method for determining the electrical properties in one light-emitting element, or between two or more light-emitting elements of a high voltage light-emitting device.

A method for forming a light-emitting device of the present application comprises providing a wafer having one test site and one device site; forming a first plurality of light-emitting elements on the test site of the wafer; providing a first connection structure to connect each of the first plurality of light-emitting elements; forming a plurality of conductive pads electrically connected to the first plurality of light-emitting elements correspondingly; forming a second plurality of light-emitting elements on the device site of the wafer; providing a second connection structure to connect each of the second plurality of light-emitting elements; applying a current flow to one of the first plurality of light-emitting elements for testing at least one electrical property of the light-emitting element while no current flow is applied to the remaining of the first plurality of light-emitting elements; sequentially applying the current flow to each of the first plurality of light-emitting elements for testing at least one electrical property of each of the first plurality of light-emitting elements; correlating the electrical property of each of the first plurality of light-emitting elements to each of the second plurality of light-emitting elements correspondingly; and dividing the wafer into a plurality of light-emitting devices.

A method for forming a light-emitting device of the present application comprises providing a wafer having one test site and one device site; forming a first light-emitting element for testing on the test site of the wafer; forming a pair of conductive pads electrically connected to the first light emitting element; forming a second plurality of light-emitting elements for commercial use on the device site of the wafer; providing a connection structure to connect each of the second plurality of light-emitting elements; and applying a current flow to the first light-emitting element for testing at least one optoelectrical property of the first light-emitting element.

DETAILED DESCRIPTION OF PREFERRED EMBODIMENTS

The embodiment of the application is illustrated in detail, and is plotted in the drawings. The same or the similar part is illustrated in the drawings and the specification with the same number.

In the first embodiment of the present application, a method for forming a high voltage light-emitting device comprising forming a first plurality of light-emitting elements 20a, 22a, and 24a on a test site of a wafer, and forming a second plurality of light-emitting elements 20, 22, and 24 on a device site of the wafer is disclosed. After an electrical yield and electrical properties of the first plurality of light-emitting elements 20a, 22a, and 24a, and the second plurality of light-emitting elements 20, 22, and 24 are characterized, a plurality of high voltage light-emitting devices containing the second plurality of light-emitting elements 20, 22, and 24 is separated from the wafer along a scribe area.

Figure 2A:
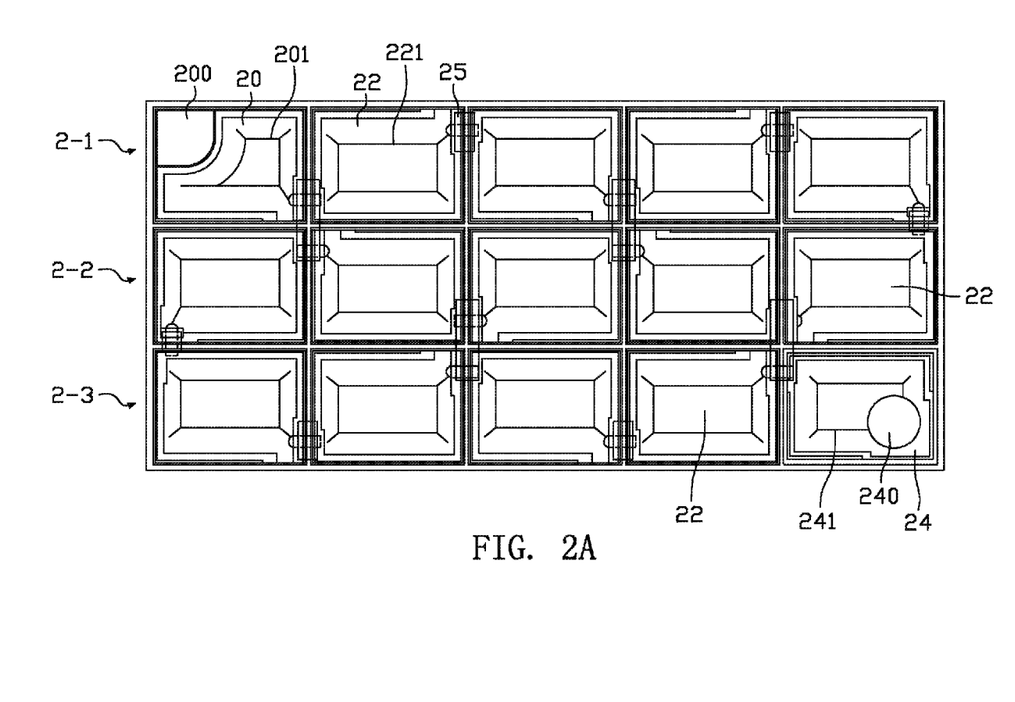
FIGS. 2A-2C illustrate a method for forming a high voltage light-emitting device according to the first embodiment of the present application.

As shown in FIG. 2A, the second plurality of light-emitting elements 20, 22, and 24 formed on the device site of the wafer is electrically connected with each other through a second connection structure 25, wherein the material of the second connection structure 25 can be conductive materials such as metal, metal alloy, and transparent conductive materials such as ITO, IZO. The number of the light-emitting elements 22 formed between the light-emitting element 20 and the light-emitting element 24 can be increased based on the desired quantity of light of the high voltage light-emitting device.

As shown in FIG. 2A, the second plurality of light-emitting elements 20, 22, and 24 comprises fifteen light-emitting elements arranged in three columns 2-1, 2-2, and 2-3. The first column 2-1 comprises one light-emitting element 20 and four light-emitting elements 22 electrically connected in series in a first direction. The second column 2-2 comprises five light-emitting elements 22 electrically connected in series in a second direction. The third column 2-3 comprises one light-emitting element 24 and four light-emitting elements 22 electrically connected in series in the first direction. The first direction and the second direction are opposite. Each of the second plurality of light-emitting elements 20, 22, and 24 comprises a semiconductor stack comprising an n-type semiconductor layer, a p-type semiconductor layer, and an active layer formed between the n-type semiconductor layer and the p-type semiconductor layer. The material of the active layer can be InGaN-based material, AlGaAs-based material, or AlGaInP-based material. The semiconductor stack is epitaxially grown on the wafer. The method of forming each semiconductor layer and the active layer is not particularly limited. Besides a metal organic chemical vapor deposition method (MOCVD method), each semiconductor layer and the active layer may be formed by a known method such as a molecular beam epitaxy method (MBE method), a hydride vapor phase epitaxy method (HVPE method), a sputtering method, an ion-plating method, an electron showering method.

The method for forming the high voltage light-emitting device further comprises forming a first-type conductive pad 200 on the light-emitting element 20 and a second-type conductive pad 240 on the light-emitting element 24. The first-type conductive pad 200 is formed on and inside the light-emitting element 20, and the second-type conductive pad 240 is formed on and inside the light-emitting element 24. The first-type conductive pad 200 and the second-type conductive pad 240 are formed for wire bonding or flip chip type bonding. As shown in FIG. 2A, the method for forming the high voltage light-emitting device further comprises forming an electrical finger structure 201 on the light-emitting element 20, an electrical finger structure 241 on the light-emitting element 24, and an electrical finger structure 221 on each of the plurality of light-emitting elements 22 for current spreading.

The material of the first-type conductive pad 200 and the second-type conductive pad 240 can be conductive material such as metal or metal alloy, and transparent conductive materials such as ITO, IZO. The shape of each of the first-type conductive pad 200 and the second-type conductive pad 240 is not particularly limited, and can be triangle shape, round shape, square shape, rectangle shape or polygonal shape. The size and the thickness of the first-type conductive pad 200 and the second-type conductive pad 240 can be formed to be equal to each other or formed to be different from each other. The polarities of the first-type conductive pad 200 and the second-type conductive pad 240 are different from each other. During an electrical test, a pair of probes contacts the first-type conductive pad 200 and the second-type conductive pad 240 correspondingly to test an overall electrical yield and electrical properties of the second plurality of light-emitting elements 20, 22, and 24. The electrical properties can be reverse leakage current and forward voltage.

According to the first embodiment of the present application, the first plurality of light-emitting elements 20a, 22a, and 24a is further formed on the test site of the wafer to characterize the electrical properties of each of the second plurality of light-emitting elements 20, 22, and 24.

Figure 2B:
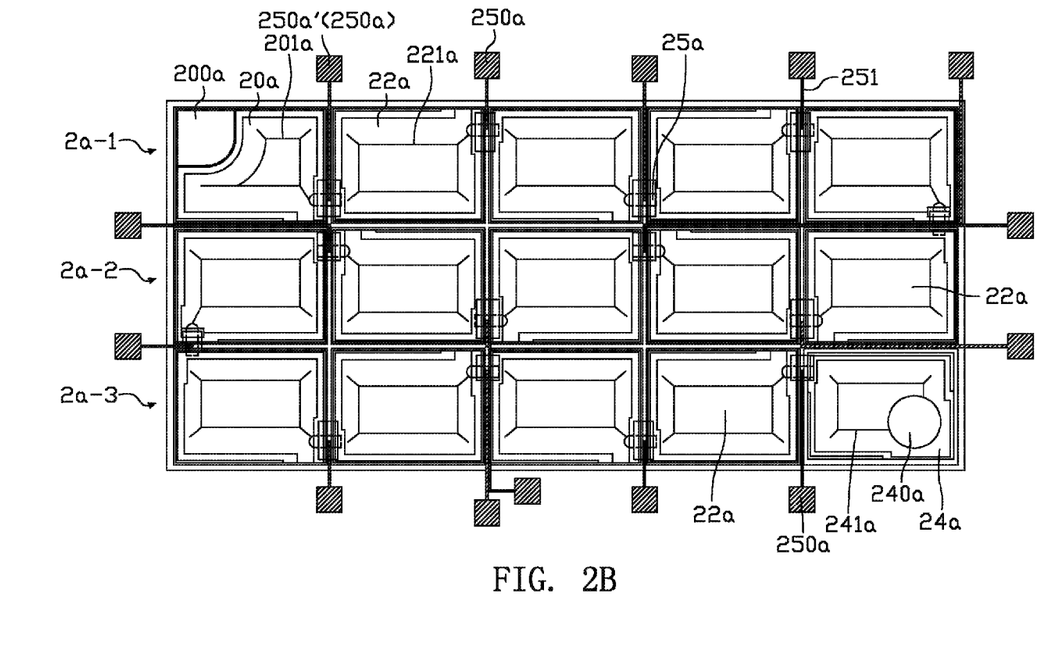

As shown in FIG. 2B, the first plurality of light-emitting elements 20a, 22a, and 24a is electrically connected with each other through a first connection structure 25a, wherein the material of the first connection structure 25a can be conductive materials such as metal, metal alloy, and transparent conductive materials such as ITO, IZO. The number of the light-emitting elements 22a formed between the light-emitting element 20a and the light-emitting element 24a is as the same as that of the light-emitting elements 22 formed between the light-emitting element 20 and the light-emitting element 24 illustrated in FIG. 2A.

As shown in FIG. 2B, the first plurality of light-emitting elements 20a, 22a, and 24a comprises fifteen light-emitting elements arranged in three columns 2a-1, 2a-2, and 2a-3. The first column 2a-1 comprises one light-emitting element 20a and four light-emitting elements 22a electrically connected in series in a first direction. The second column 2a-2 comprises five light-emitting elements 22a electrically connected in series in a second direction. The third column 2a-3 comprises one light-emitting element 24a and four light-emitting elements 22a electrically connected in series in the first direction. The first direction and the second direction are opposite. Each of the first plurality of light-emitting elements 20a, 22a, and 24a comprises a semiconductor stack comprising an n-type semiconductor layer, a p-type semiconductor layer, and an active layer formed between the n-type semiconductor layer and the p-type semiconductor layer. The material of the active layer can be InGaN-based material, AlGaAs-based material, or AlGaInP-based material. The semiconductor stack is epitaxially grown on the wafer. The method of forming each semiconductor layer and the active layer is not particularly limited. Besides a metal organic chemical vapor deposition method (MOCVD method), each semiconductor layer and the active layer may be formed by a known method such as a molecular beam epitaxy method (MBE method), a hydride vapor phase epitaxy method (HVPE method), a sputtering method, an ion-plating method, an electron showering method.

The method for forming the high voltage light-emitting device further comprises forming a plurality of conductive pads 200a, 250a, and 240a electrically connected to the first plurality of light-emitting elements 20a, 22a, and 24a correspondingly. Among the plurality of conductive pads 200a, 240a, and 250a, one conductive pad 200a is formed on and inside the light-emitting element 20a of the first column 2a-1, and one conductive pad 240a is formed on and inside the light-emitting element 24a of the third column 2a-3. The conductive pad 200a and the conductive pad 240a are formed for wire bonding or flip chip type bonding. The remaining conductive pads 250a are formed around the first plurality of light-emitting elements 20a, 22a, and 24a, and outside any one light-emitting element 20a, 22a, and 24a. Each of the plurality of conductive pads 200a, 250a, and 240a is electrically connected to the first plurality of light-emitting elements 20a, 22a, and 24a correspondingly through the first connection structure 25a and an extension structure 251. The material of the extension structure 251 can be as the same as that of the first connection structure 25a. As shown in FIG. 2B, an electrical finger structure 201a is formed on the light-emitting element 20a, an electrical finger structure 241a is formed on the light-emitting element 24a, and an electrical finger structure 221a is formed on each of the plurality of light-emitting elements 22a for current spreading.

The shape of each of the plurality of conductive pads 200a, 240a, and 250a is not particularly limited, and can be triangle shape, round shape, square shape, rectangle shape or polygonal shape. The size and the thickness of the plurality of conductive pads 200a, 240a, and 250a can be formed to be equal to each other or formed to be different from each other. The shape and size of each of the plurality of conductive pads 200a, 240a, and 250a can be formed by a conventional lithography. The material of the plurality of conductive pads 200a, 240a, and 250a can be conductive material such as metal or metal alloy, and transparent conductive materials such as ITO, IZO. The electrical polarities of the conductive pad 200a and the conductive pad 240a are different from each other. The method for forming each of the plurality of conductive pads 200a, 240a, and 250a is not particularly limited. Besides a chemical vapor deposition (CVD) method, each of the plurality of conductive pads 200a, 240a, and 250a may be formed by a method such as a metal sputtering, chemical plating, or electron beam evaporation.

The method for testing at least one electrical property of the first plurality of light-emitting elements 20a, 22a, and 24a can be manual probing test or automatic probing test. According to an embodiment of the present application, the distance between each of the plurality of conductive pads 250a can be fixed at a constant value for automatic electrical testing or not fixed for manual electrical testing. To perform the test, a current flow is applied to one of the first plurality of light-emitting elements 20a, 22a, and 24a, for example, the light-emitting element 20a, while no current flow is applied to the remaining of the first plurality of light-emitting elements, for example, the light-emitting elements 22a and 24a, during testing the light-emitting element 20a. Preferably, the current flow is sequentially applied to the first plurality of light-emitting elements 20a, 22a, and 24a for testing at least one electrical property while no current flow is applied to the light-emitting elements that are not under testing. The electrical properties can be reverse leakage current and forward voltage.

In the embodiment, the current flow is injected to the light-emitting element 20a from a pair of probes through the conductive pad 200a and the conductive pad 250a'(250a) during the electrical test, and no current flow is applied to the remaining of the first plurality of light-emitting elements 22a and 24a.

According to the first embodiment of the present application, there are K light-emitting elements in the first plurality of light-emitting elements 20a, 22a, and 24a, and (K+1) conductive pads, wherein K is an integer satisfying K≥2.

By correlating with the electrical property of each of the first plurality of light-emitting elements 20a, 22a, and 24a correspondingly, an overall electrical yield of the second plurality of light-emitting elements 20, 22, and 24, and at least one electrical property of each of the second plurality of light-emitting elements 20, 22, and 24 can be monitored. The electrical defect in any one of the second plurality of light-emitting elements 20, 22, and 24 can be monitored by sequentially applying the current flow to the first plurality of light-emitting elements 20a, 22a, and 24a while no current flow is applied to the light-emitting elements that are not under testing.

As shown in FIGS. 2A-2B, the first plurality of light-emitting elements 20a, 22a, and 24a for testing comprises the same number of light-emitting elements as the second plurality of light-emitting elements 20, 22, and 24. Because the light-emitting element 20a comprises a structure approximately the same as that of the light-emitting element 20, the electrical properties of the light-emitting element 20a can be correlated to the electrical properties of the light-emitting element 20. Because the light-emitting element 24a comprises a structure approximately same as that of the light-emitting element 24, the electrical properties of the light-emitting element 24a can be correlated to the electrical properties of the light-emitting element 24. Because each light-emitting element 22a comprises a structure approximately the same as that of each light-emitting element 22, the electrical properties of the light-emitting element 22a can be correlated to the electrical properties of the light-emitting element 22.

During the fabrication processes of the high voltage light-emitting device, some manufacture deviations such as contamination, equipment malfunction or process excursion may occur and cause the electrical connection failure and electrical yield loss between the second plurality of light-emitting elements 20, 22, and 24. When there is an electrical defect described above in the second plurality of light-emitting elements 20, 22, and 24, one can identify the location of electrical defect in the second plurality of light-emitting elements 20, 22, and 24 by the method illustrated above.

Figure 2C:
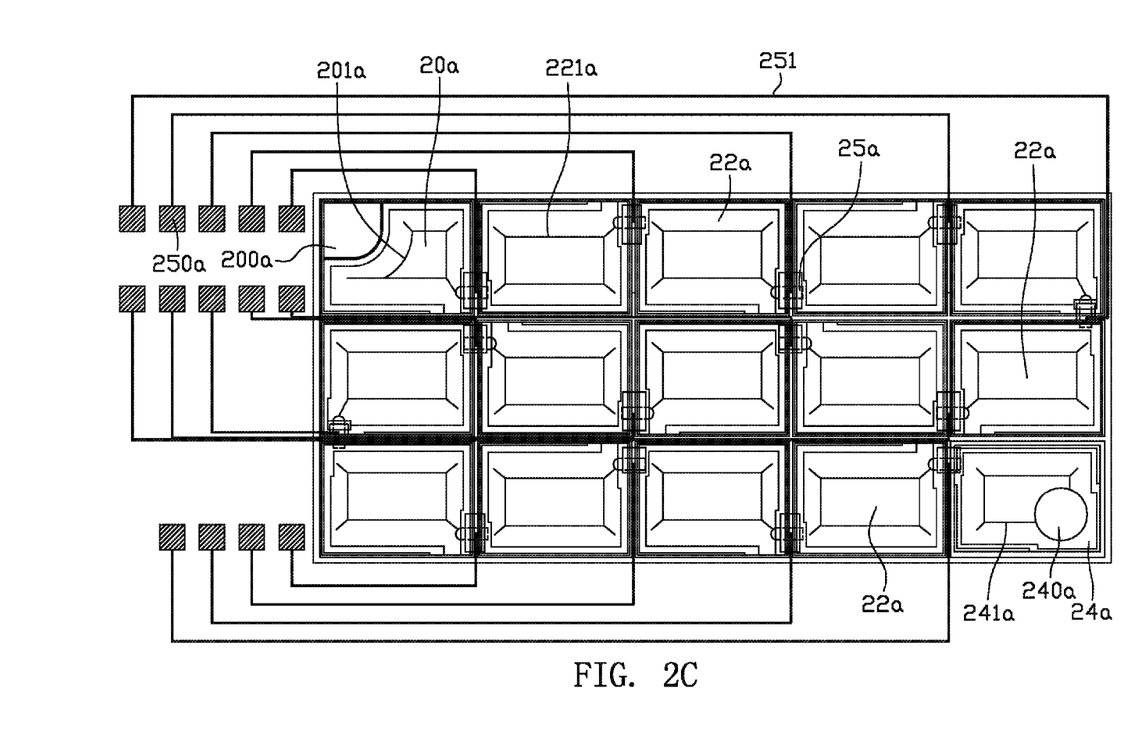

FIG. 2C illustrates another example of the method for forming the high voltage light-emitting device according to the first embodiment of the present application. For the plurality of conductive pads 200a, 240a, and 250a, the conductive pad 200a is formed on and inside the light-emitting element 20a, and the conductive pad 240a is formed on and inside the light-emitting element 24a. The remaining conductive pads 250a are formed at one side of the first plurality of light-emitting elements 20a, 22a, and 24a, and outside any one of the first plurality of light-emitting element 20a, 22a, and 24a. Each of the plurality of conductive pads 200a, 240a, and 250a is electrically connected to the first plurality of light-emitting elements 20a, 22a, and 24a correspondingly through the first connection structure 25a and the extension structure 251.

Figure 3A:
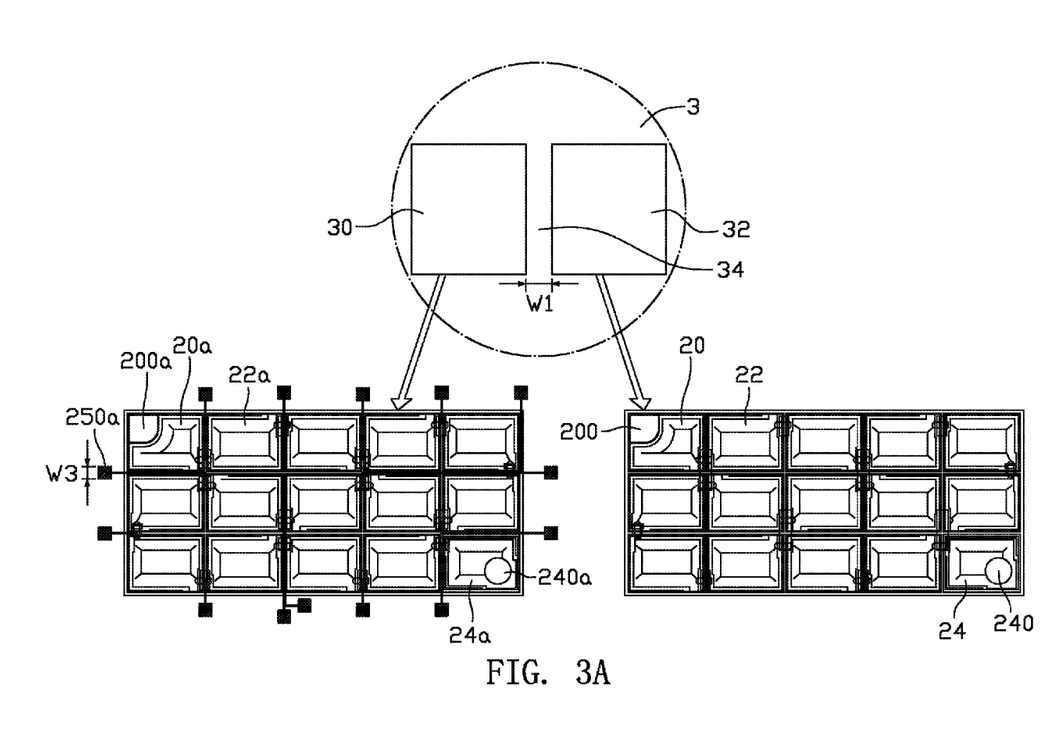
FIGS. 3A-3B illustrate a method for forming a high voltage light-emitting device according to one embodiment of the present application.

As shown in FIG. 3A, the second plurality of light-emitting elements 20, 22, and 24, and the first plurality of light-emitting elements 20a, 22a, and 24a are formed on the wafer 3, wherein the wafer 3 has one test site 30 where the first plurality of light-emitting elements 20a, 22a, and 24a for electrical testing is located and one device site 32 where the second plurality of light-emitting elements 20, 22, and 24 is located according to the first embodiment of the present application. The material of the wafer 3 can be sapphire ($Al_2O_3$), silicon (Si), silicon carbide (SiC), gallium nitride (GaN), or gallium arsenide (GaAs). As illustrated in FIG. 3A, the test site 30 has an area equal to that of the device site 32. The wafer 3 further has a scribe area 34 having a width W1 separating the test site 30 from the device site 32. In an embodiment of the present application, the width W1 is between 5 µm to 100 µm. As shown in FIG. 3A, each of the plurality of conductive pads 250a formed around the first plurality of light-emitting elements 20a, 22a, and 24a has a width W3 smaller than the width W1 of the scribe area 34.

After the first plurality of light-emitting elements 20a, 22a, and 24a for testing and the second plurality of light-emitting elements 20, 22, and 24 are formed on the wafer 3, at least one electrical property of each of the first plurality of light-emitting elements 20a, 22a, and 24a is obtained by applying a current flow to each of the first plurality of light-emitting elements 20a, 22a, and 24a through the plurality of conductive pads 200a, 250a, and 240a sequentially, and an overall electrical yield and electrical properties of the second plurality of light-emitting elements 20, 22, and 24 are obtained by applying a current flow to the second plurality of light-emitting elements 20, 22, and 24 through the first-type conductive pad 200 and the second-type conductive pad 240. At least one electrical property of each of the second plurality of light-emitting elements 20, 22, and 24 can be obtained by monitoring the electrical properties of each of the first plurality of light-emitting elements 20a, 22a, and 24a with the method illustrated in FIGS. 2A-2C. The measurement sequence of the first plurality of light-emitting elements 20a, 22a, and 24a and the second plurality of light-emitting elements 20, 22, and 24 is not limited. The electrical properties of the first plurality of light-emitting elements 20a, 22a, and 24a can be measured in the beginning or at the end of the test. After all the electrical properties of the first plurality of light-emitting elements 20a, 22a, and 24a, and the second plurality of light-emitting elements 20, 22, and 24 are measured, the wafer 3 is divided into a plurality of high voltage light-emitting devices (not shown) along the scribe area 34. Each of the plurality of high voltage light-emitting devices (not shown) comprising the second plurality of light-emitting elements 20, 22, and 24 can be shipped to the customer according to the different electrical specification.

Figure 3B:
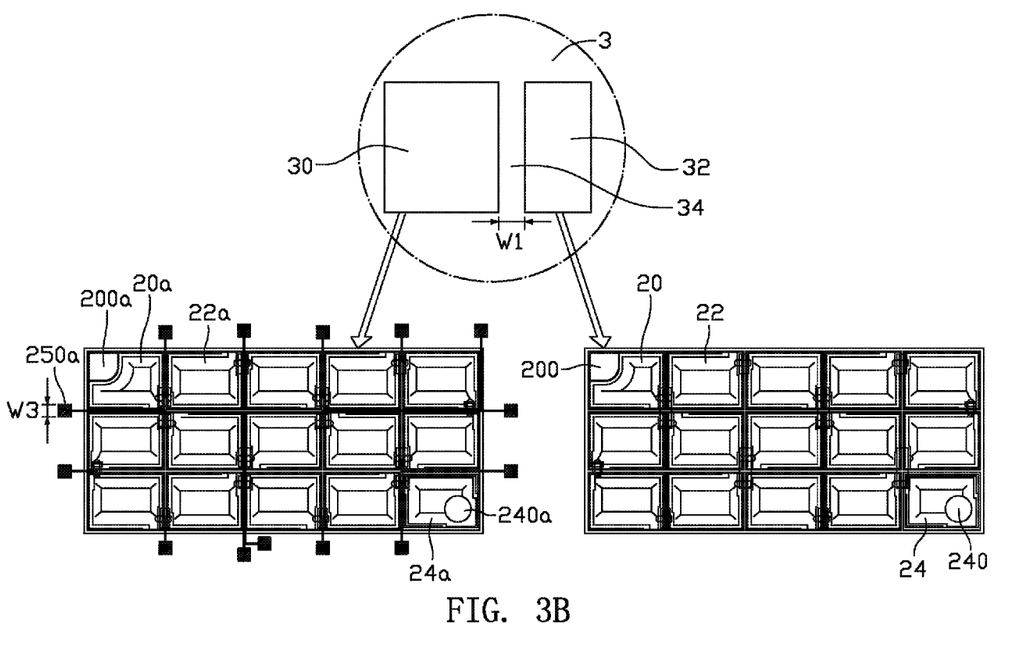

FIG. 3B illustrates another embodiment of the present application. The method for forming the high voltage light-emitting device comprises providing the wafer 3, wherein the wafer 3 has one test site 30 where the first plurality of light-emitting elements 20a, 22a, and 24a for electrical testing is located and one device site 32 where the second plurality of light-emitting elements 20, 22, and 24 is located. According to the embodiment illustrated in FIG. 3B, the area of the test site 30 is multiple times of the area of the device site 32. The scribe area 34 of the wafer 3 has the width W1 separating the test site 30 from the device site 32. In an embodiment of the present application, the width W1 is between 5 µm to 100 µm. As shown in FIG. 3B, each of the plurality of conductive pads 250a formed around the first plurality of light-emitting elements 20a, 22a, and 24a has the width W3 larger than the width W1 of the scribe area 34.

Figure 4A:
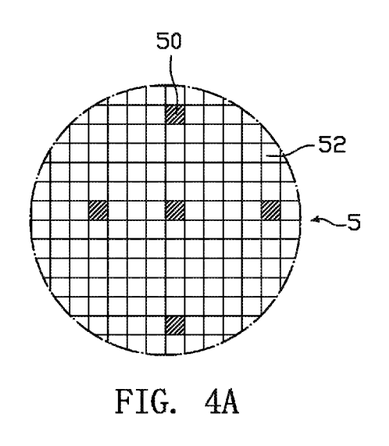
FIGS. 4A-4D illustrate a method for forming a high voltage light-emitting device according to one embodiment of the present application.
Figure 4B:
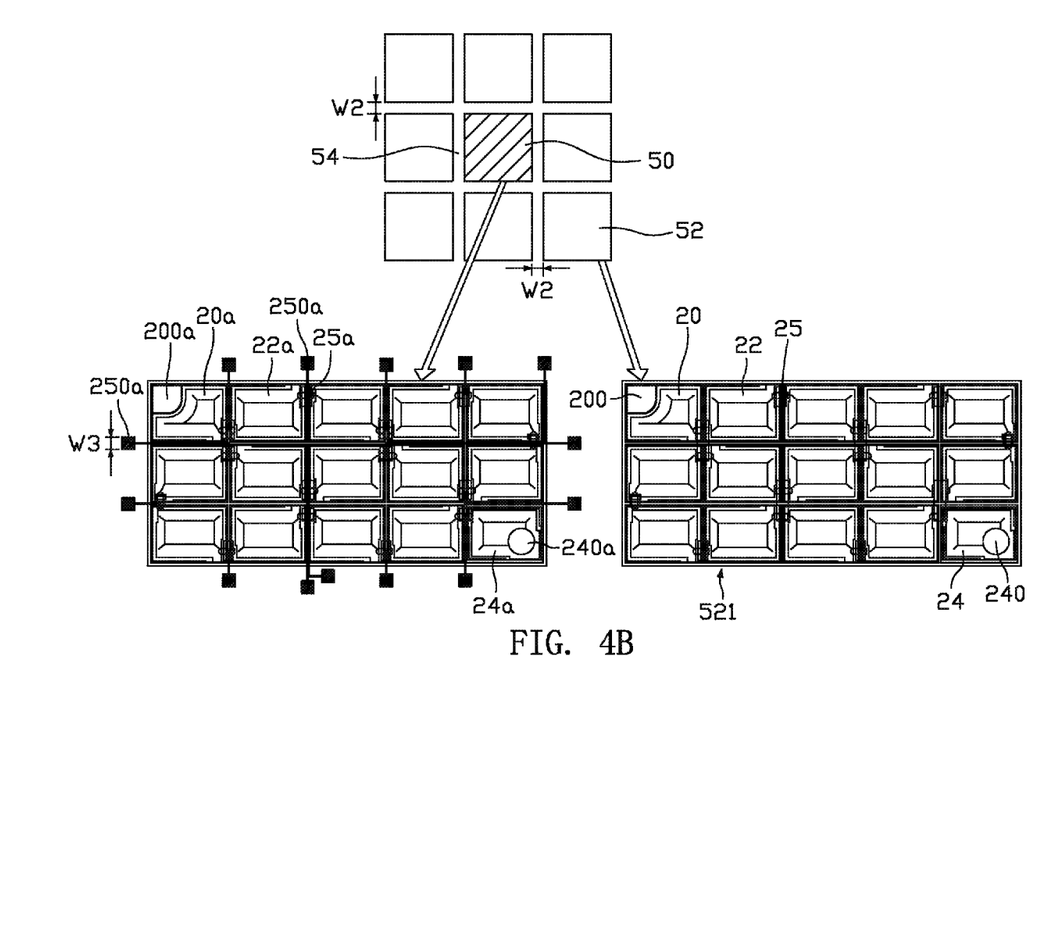

As shown in FIGS. 4A-4B, the method for forming the high voltage light-emitting device comprises providing a wafer 5 having a plurality of test sites 50 and a plurality of device sites 52, wherein the material of the wafer 5 can be sapphire ($Al_2O_3$), silicon (Si), silicon carbide (SiC), gallium nitride (GaN), or gallium arsenide (GaAs); forming the first plurality of light-emitting elements 20a, 22a, and 24a for testing on each of the plurality of test sites 50 of the wafer 5, wherein each of the first plurality of light-emitting elements 20a, 22a, and 24a is connected in series or in parallel through the first connection structure 25a, wherein the material of the first connection structure 25a can be conductive materials such as metal or metal alloy; forming the second plurality of light-emitting elements 20, 22, and 24 on each of the plurality of device sites 52 of the wafer 5, wherein each of the second plurality of light-emitting elements 20, 22, and 24 is connected in series or in parallel through the second connection structure 25, wherein the material of the second connection structure 25 can be conductive materials such as metal or metal alloy; and sequentially applying a current flow to the first plurality of light-emitting elements 20a, 22a, and 24a for testing at least one electrical property while no current flow is applied to the light-emitting elements that are not under testing.

According to the embodiment illustrated in FIG. 4B, the test site 50 has an area equal to that of the device site 52. The wafer 5 further has a scribe area 54 having a width W2 separating the test site 50 from the device site 52. In an embodiment of the present application, the width W2 is between 5 µm to 100 µm. As shown in FIG. 4B, the width W3 of each of the plurality of conductive pads 250a formed around the first plurality of light-emitting elements 20a, 22a, and 24a is smaller than the width W2 of the scribe area 54. The scribe area 54 forms a grid pattern between the plurality of device sites 52 and the plurality of test sites 50.

As shown in FIG. 4B, after the first plurality of light-emitting elements 20a, 22a, and 24a for testing, and the second plurality of light-emitting elements 20, 22, and 24 are formed on the wafer 5, at least one electrical property of each of the first plurality of light-emitting elements 20a, 22a, and 24a is obtained by applying a current flow to each of the first plurality of light-emitting elements 20a, 22a, and 24a through the plurality of conductive pads 200a, 250a, and 240a sequentially, and an overall electrical yield and electrical properties of the second plurality of light-emitting elements 20, 22, and 24 are obtained by applying a current flow to the second plurality of light-emitting elements 20, 22, and 24 through the first-type conductive pad 200 and the second-type conductive pad 240. At least one electrical property of each of the second plurality of light-emitting elements 20, 22, and 24 can be obtained by monitoring the electrical properties of each of the first plurality of light-emitting elements 20a, 22a, and 24a with the method illustrated in FIGS. 2A-2C. The measurement sequence of the first plurality of light-emitting elements 20a, 22a, and 24a and the second plurality of light-emitting elements 20, 22, and 24 is not limited. The electrical properties of the first plurality of light-emitting elements 20a, 22a, and 24a can be measured in the beginning or at the end of the test. After all the electrical properties of the first plurality of light-emitting elements 20a, 22a, and 24a, and the second plurality of light-emitting elements 20, 22, and 24 are measured, the wafer 5 is divided into a plurality of high voltage light-emitting devices (not shown) along the scribe area 54. Each of the plurality of high voltage light-emitting devices (not shown) comprising the second plurality of light-emitting elements 20, 22, and 24 can be shipped to the customer according to the different electrical specification.

Figure 4C:
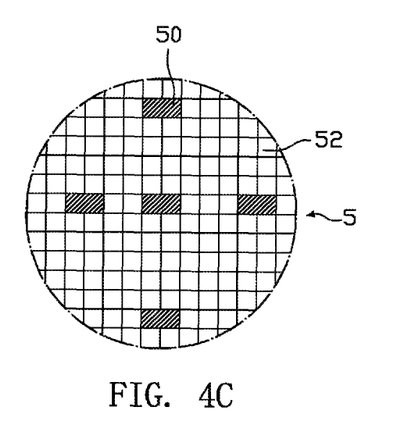
Figure 4D:
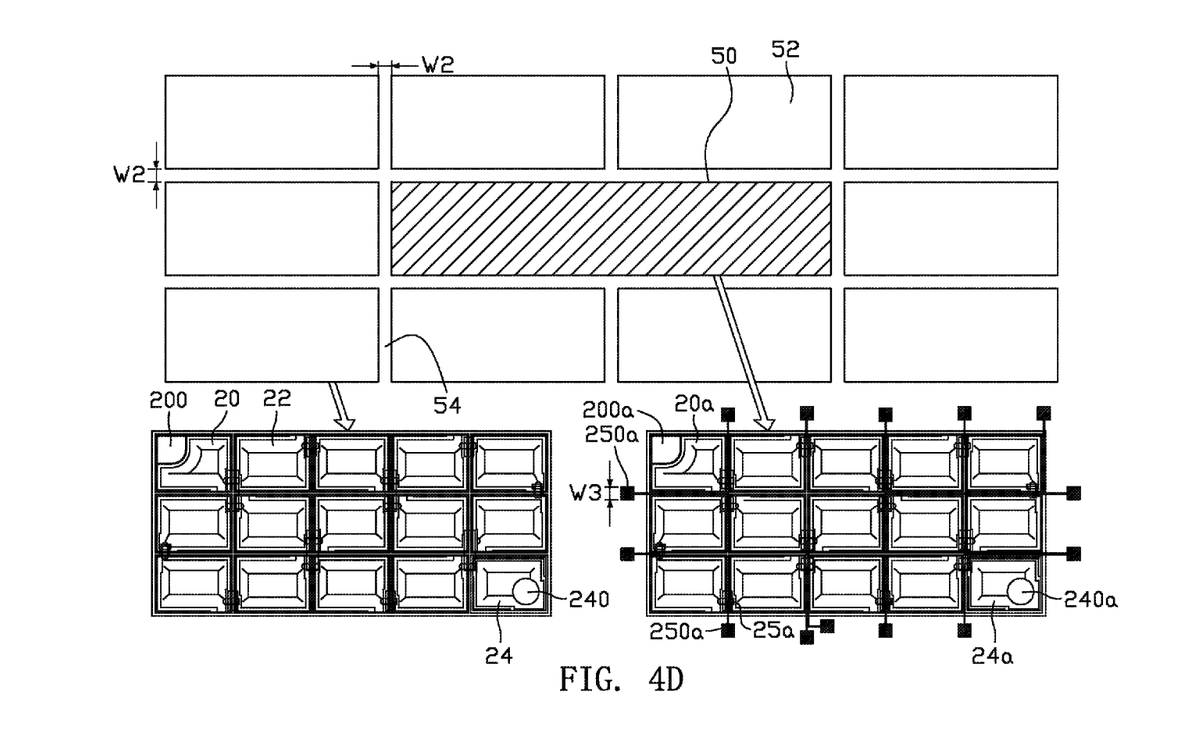

FIGS. 4C-4D illustrate another embodiment of the present application. The method for forming the high voltage light-emitting device comprises providing the wafer 5 having the plurality of test sites 50 and the plurality of device sites 52; forming the first plurality of light-emitting elements 20a, 22a, and 24a for testing on each of the plurality of test sites 50 of the wafer 5, wherein each of the first plurality of light-emitting elements 20a, 22a, and 24a is connected in series or in parallel through the first connection structure 25a; forming the second plurality of light-emitting elements 20, 22, and 24 on each of the plurality of device sites 52 of the wafer 5, wherein each of the second plurality of light-emitting elements 20, 22, and 24 is connected in series or in parallel through the second connection structure 25; and sequentially applying a current flow to the first plurality of light-emitting elements 20a, 22a, and 24a for testing at least one electrical property while no current flow is applied to the light-emitting elements that are not under testing.

According to the embodiment illustrated in FIG. 4C, the area of the test site 50 is multiple times of the area of the device site 52. The wafer 5 has the scribe area 54 having the width W2 separating the test site 50 from the device site 52. In an embodiment of the present application, the width W2 is between 5 μm to 100 μm. As shown in FIG. 4D, each of the plurality of conductive pads 250a formed around the first plurality of light-emitting elements 20a, 22a, and 24a has the width W3 larger than the width W2 of the scribe area 54. The scribe area 54 forms a grid pattern between the plurality of device sites 52 and the plurality of test sites 50.

As shown in FIGS. 4C-4D, after the first plurality of light-emitting elements 20a, 22a, and 24a for testing and the second plurality of light-emitting elements 20, 22, and 24 are formed on the wafer 5, at least one electrical property of each of the first plurality of light-emitting elements 20a, 22a, and 24a is obtained by applying a current flow to each of the first plurality of light-emitting elements 20a, 22a, and 24a through the plurality of conductive pads 200a, 250a, and 240a sequentially, and an overall electrical yield and electrical properties of the second plurality of light-emitting elements 20, 22, and 24 are obtained by applying a current flow to the second plurality of light-emitting elements 20, 22, and 24 through the first-type conductive pad 200 and the second-type conductive pad 240. At least one electrical property of each of the second plurality of light-emitting elements 20, 22, and 24 can be obtained by monitoring the electrical properties of each of the first plurality of light-emitting elements 20a, 22a, and 24a with the method illustrated in FIGS. 2A-2C. The measurement sequence of the first plurality of light-emitting elements 20a, 22a, and 24a and the second plurality of light-emitting elements 20, 22, and 24 is not limited. The electrical properties of the first plurality of light-emitting elements 20a, 22a, and 24a can be measured in the beginning or at the end of the test. After all the electrical properties of the first plurality of light-emitting elements 20a, 22a, and 24a, and the second plurality of light-emitting elements 20, 22, and 24 are measured, the wafer 5 is divided into a plurality of high voltage light-emitting devices (not shown) along the scribe area 54. Each of the plurality of high voltage light-emitting devices (not shown) can be shipped to the customer according to the different electrical specification.

Figure 5A:
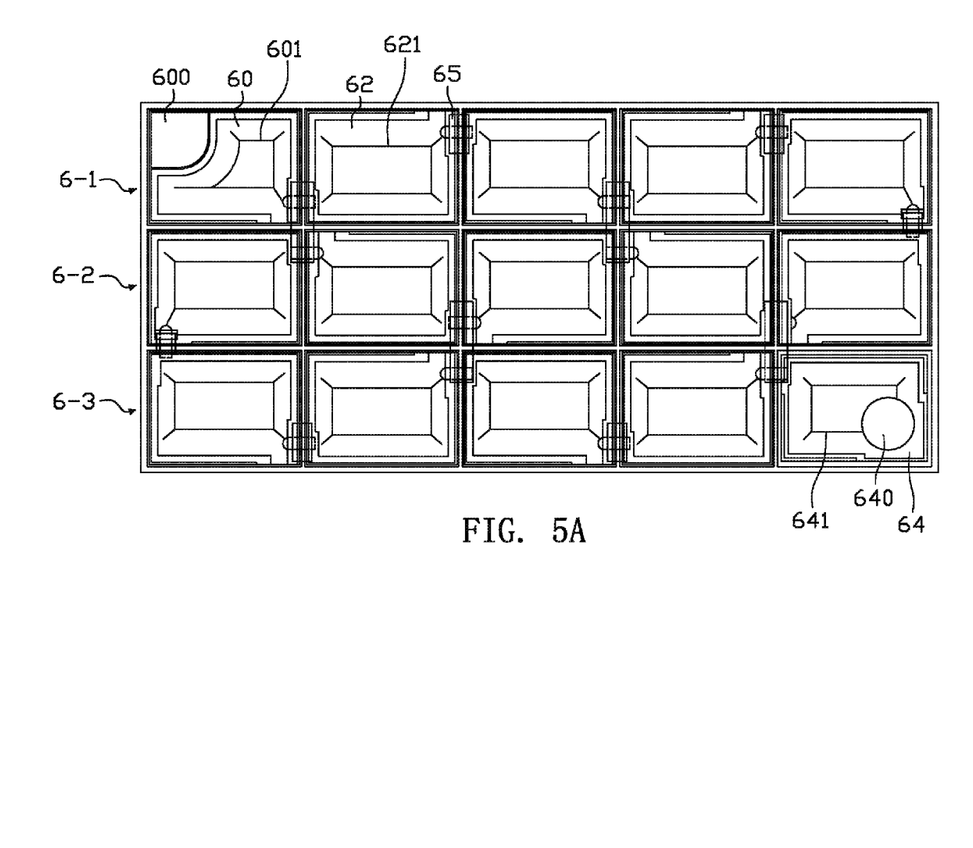
FIGS. 5A-5D illustrate a method for forming a high voltage light-emitting device according to the second embodiment of the present application.

As shown in FIG. 5A, a second plurality of light-emitting elements 60, 62, and 64 formed on the device site of the wafer is electrically connected with each other through a second connection structure 65, wherein the material of the second connection structure 65 can be conductive materials such as metal, metal alloy, and transparent conductive materials such as ITO, IZO. The number of the light-emitting elements 62 formed between the light-emitting element 60 and the light-emitting element 64 can be increased based on the desired quantity of light of the high voltage light-emitting device.

As shown in FIG. 5A, the second plurality of light-emitting elements 60, 62, and 64 comprises fifteen light-emitting elements arranged in three columns 6-1, 6-2, and 6-3. The first column 6-1 comprises one light-emitting element 60 and four light-emitting elements 62 electrically connected in series in a first direction. The second column 6-2 comprises five light-emitting elements 62 electrically connected in series in a second direction. The third column 6-3 comprises one light-emitting element 64 and four light-emitting elements 62 electrically connected in series in the first direction. The first direction and the second direction are opposite. Each of the second plurality of light-emitting elements 60, 62, and 64 comprises a semiconductor stack comprising an n-type semiconductor layer, a p-type semiconductor layer, and an active layer formed between the n-type semiconductor layer and the p-type semiconductor layer. The material of the active layer can be InGaN-based material, AlGaAs-based material, or AlGaInP-based material. The semiconductor stack is epitaxially grown on the wafer. The method of forming each semiconductor layer and the active layer is not particularly limited. Besides a metal organic chemical vapor deposition method (MOCVD method), each semiconductor layer and the active layer may be formed by a known method such as a molecular beam epitaxy method (MBE method), a hydride vapor phase epitaxy method (HVPE method), a sputtering method, an ion-plating method, an electron showering method.

The method for forming the high voltage light-emitting device further comprises forming a first-type conductive pad 600 on the light-emitting element 60 and a second-type conductive pad 640 on the light-emitting element 64. The first-type conductive pad 600 is formed on and inside the light-emitting element 60, and the second-type conductive pad 640 is formed on and inside the light-emitting element 64. The first-type conductive pad 600 and the second-type conductive pad 640 are formed for wire bonding or flip chip type bonding. As shown in FIG. 5A, the method for forming the high voltage light-emitting device further comprises forming an electrical finger structure 601 on the light-emitting element 60, an electrical finger structure 641 on the light-emitting element 64, and an electrical finger structure 621 on each of the plurality of light-emitting elements 62 for current spreading.

The material of the first-type conductive pad 600 and the second-type conductive pad 640 can be conductive material such as metal or metal alloy, and transparent conductive materials such as ITO, IZO. The shape of each of the first-type conductive pad 600 and the second-type conductive pad 640 is not particularly limited, and can be triangle shape, round shape, square shape, rectangle shape or polygonal shape. The size and the thickness of the first-type conductive pad 600 and the second-type conductive pad 640 can be formed to be equal to each other or formed to be different from each other. The polarities of the first-type conductive pad 600 and the second-type conductive pad 640 are different from each other. During an electrical test, a pair of probes contacts the first-type conductive pad 600 and the second-type conductive pad 640 correspondingly to test an overall electrical yield and electrical properties of the second plurality of light-emitting elements 60, 62, and 64. The electrical properties can be reverse leakage current and forward voltage.

Figure 5B:
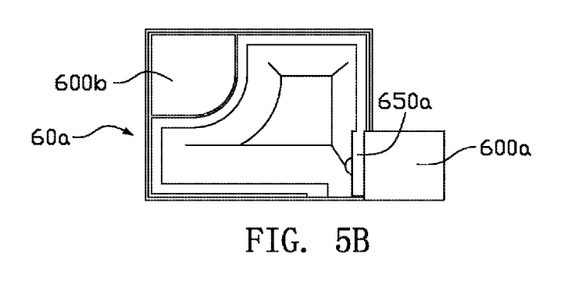

According to the second embodiment of the present application, the method for forming the high voltage light-emitting device further comprises forming the first light-emitting element 60a for testing on the test site of the wafer to characterize the electrical properties of the second plurality of light-emitting elements 60, 62, and 64. As shown in FIG. 5A and FIG. 5B, the first light-emitting element 60a comprises substantial the same structure as one of the second plurality of light-emitting element 60, 62, and 64, for example, the light-emitting element 60.

As shown in FIG. 5B, a pair of conductive pads 600a and 600b are electrically connected to the first light-emitting element 60a, wherein one of the pair of conductive pads, for example, the conductive pad 600b, is formed on and inside the first light emitting element 60a, wherein another one of the pair of conductive pads, for example, the conductive pad 600a, is formed outside the first light emitting element 60a and electrically connected to the first light-emitting element 60a through a connection structure 650a. The material of the connection structure 650a can be conductive materials such as metal, metal alloy, and transparent conductive materials such as ITO, IZO. The material of the pair of conductive pads 600a and 600b can be conductive material such as metal or metal alloy and transparent conductive materials such as ITO, IZO. The shape of each of the pair of conductive pads 600a and 600b is not particularly limited, and can be triangle shape, round shape, square shape, rectangle shape or polygonal shape. The size and the thickness of the conductive pads 600a and 600b can be formed to be equal to each other or formed to be different from each other. The polarities of the conductive pad 600a and the conductive pad 600b are different from each other. To perform the electrical test, a current flow is applied to the first light-emitting element 60a through the conductive pad 600a and the conductive pad 600b.

Figure 5C:
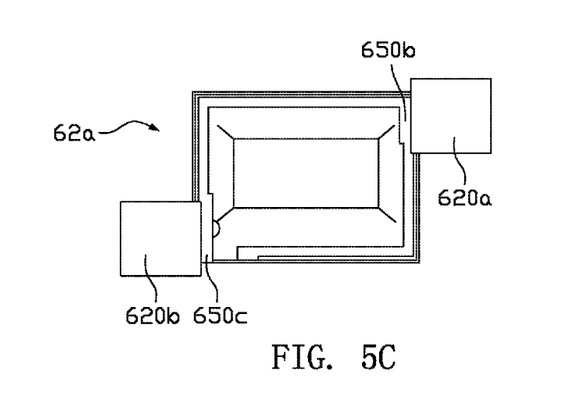

According to the second embodiment of the present application, the method for forming the high voltage light-emitting device further comprises forming a third light-emitting element 62a for testing on the test site of the wafer, wherein the third light-emitting element 62a is different from the first light-emitting element 60a in electrode pattern layout. As shown in FIGS. 5A and 5C, the third light-emitting element 62a comprises substantial the same structure as one of the second plurality of light-emitting element 60, 62, and 64, for example, the light-emitting element 62.

As shown in FIG. 5C, a pair of conductive pads 620a and 620b are electrically connected to the third light-emitting element 62a, wherein the pair of conductive pads 620a and 620b is formed outside the third light-emitting element 62a, and electrically connected to the third light-emitting element 62a through a connection structure 650b and a connection structure 650c respectively. The material of the connection structures 650b and 650c can be conductive materials such as metal, metal alloy, and transparent conductive materials such as ITO, IZO. The material of the pair of conductive pads 620a and 620b can be conductive material such as metal or metal alloy, and transparent conductive materials such as ITO, IZO. The shape of each of the pair of conductive pads 620a and 620b is not particularly limited, and can be triangle shape, round shape, square shape, rectangle shape or polygonal shape. The size and the thickness of the conductive pads 620a and 620b can be formed to be equal to each other or formed to be different from each other. The polarities of the conductive pad 620a and the conductive pad 620b are different from each other. To perform the electrical test, a current flow is applied to the third light-emitting element 62a through the conductive pad 620a and the conductive pad 620b.

Figure 5D:
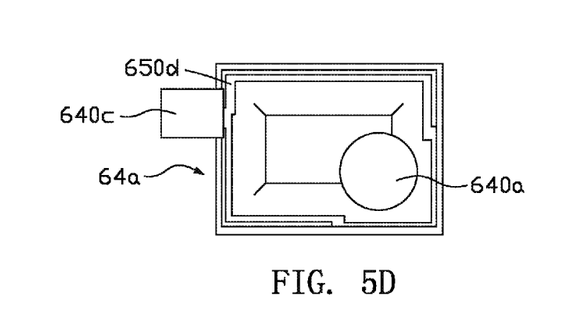

According to the second embodiment of the present application, the method for forming the high voltage light-emitting device further comprises forming a fourth light-emitting element 64a for testing on the test site of the wafer, wherein the fourth light-emitting element 64a is different from the first light-emitting element 60a and the third light-emitting element 62a in electrode pattern layout. As shown in FIGS. 5A and 5D, the fourth light-emitting element 64a comprises substantial the same structure as one of the second plurality of light-emitting element 60, 62, and 64, for example, the light-emitting element 64.

As shown in FIG. 5D, a pair of conductive pads 640a and 640c are electrically connected to the fourth light-emitting element 64a, wherein one of the pair of conductive pads, for example, the conductive pads 640a is formed on and inside the fourth light emitting element 64a, wherein another one of the pair of conductive pads, for example, the conductive pad 640c is formed outside the fourth light emitting element 64a and electrically connected to the fourth light-emitting elements 64a through a connection structure 650d. The material of the connection structure 650d can be conductive materials such as metal, metal alloy, and transparent conductive materials such as ITO, IZO. The material of the pair of conductive pads 640a and 640c can be conductive material such as metal or metal alloy and transparent conductive materials such as ITO, IZO. The shape of each of the pair of conductive pads 640a and 640c is not particularly limited, and can be triangle shape, round shape, square shape, rectangle shape or polygonal shape. The size and the thickness of the conductive pads 640a and 640c can be formed to be equal to each other or formed to be different from each other. The polarities of the conductive pad 640a and the conductive pad 640c are different from each other. To perform the electrical test, a current flow is applied to the fourth light-emitting element 64a through the conductive pad 640a and the conductive pad 640c.

By correlating with the electrical property of each of the first light-emitting elements 60a, the third light-emitting element 62a, and the fourth light-emitting element 64a correspondingly, an overall electrical yield of the second plurality of light-emitting elements 60, 62, and 64, and at least one electrical property of each of the second plurality of light-emitting elements 60, 62, and 64 can be monitored.

As shown in FIGS. 5B-5D, each of the light-emitting elements 60a, 62a, and 64a comprises a semiconductor stack comprising an n-type semiconductor layer, a p-type semiconductor layer, and an active layer formed between the n-type semiconductor layer and the p-type semiconductor layer. The material of the active layer can be InGaN-based material, AlGaAs-based material, or AlGaInP-based material. The semiconductor stack is epitaxially grown on the wafer. The method of forming each semiconductor layer and the active layer is not particularly limited. Besides a metal organic chemical vapor deposition method (MOCVD method), each semiconductor layer and the active layer may be formed by a known method such as a molecular beam epitaxy method (MBE method), a hydride vapor phase epitaxy method (HVPE method), a sputtering method, an ion-plating method, an electron showering method.

As shown in FIGS. 3A-3B and FIG. 5A, the second plurality of light-emitting elements 60, 62, and 64 can be located on the device site 32 of the wafer 3. As shown in FIGS. 4A-4D and FIG. 5A, the second plurality of light-emitting elements 60, 62, and 64 can be located on the device site 52 of the wafer 5. As shown in FIGS. 3A-3B and FIGS. 5B-5D, the first light-emitting element 60a, the third light-emitting element 62a and the fourth light-emitting element 64a for testing can be located on the test site 30 of the wafer 3. As shown in FIGS. 4A-4D and FIGS. 5B-5D, the first light-emitting element 60a, the third light-emitting element 62a and the fourth light-emitting element 64a for testing can be located on the test sites 50 of the wafer 5.

After the first light-emitting element 60a, the third light-emitting element 62a, and the fourth light-emitting element 64a for testing are formed on the test site of the wafer, and the second plurality of light-emitting elements 60, 62, and 64 are formed on the device site of wafer, at least one electrical property of each of the first light-emitting element 60a, the third light-emitting element 62a, and the fourth light-emitting element 64a is obtained by applying a current flow to each of the first light-emitting element 60a, the third light-emitting element 62a, and the fourth light-emitting element 64a through the pair of conductive pads 600a and 600b, the pair of conductive pads 620a and 620b, and the pair of conductive pads 640a and 640c respectively, and an overall electrical yield and electrical properties of the second plurality of light-emitting elements 60, 62, and 64 are obtained by applying a current flow to the second plurality of light-emitting elements 60, 62, and 64 through the first-type conductive pad 600 and the second-type conductive pad 640. At least one electrical property of each of the second plurality of light-emitting elements 60, 62, and 64 can be obtained by monitoring the electrical properties of each of the light-emitting elements 60a, 62a, and 64a with the method illustrated in FIGS. 5B-5D.

The measurement sequence of the first light-emitting element 60a, the third light-emitting element 62a, the fourth light-emitting element 64a, and the second plurality of light-emitting elements 60, 62, and 64 is not limited. The electrical properties of the second plurality of light-emitting elements 60, 62, and 64 can be measured in the beginning or at the end of the test. After all the electrical properties of the first light-emitting element 60a, the third light-emitting element 62a, the fourth light-emitting element 64a, and the second plurality of light-emitting elements 60, 62, and 64 are provided, the wafer 3 or the wafer 5 is divided into a plurality of light-emitting devices (not shown) along the scribe area 34 or the scribe area 54 respectively. Each of the plurality of high voltage light-emitting devices (not shown) can be shipped to the customer according to the different electrical specification.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A method for forming a light-emitting device, comprising:
providing a wafer;
forming a first light-emitting element comprising a first electrode pattern for testing on the wafer;
forming a second light-emitting element comprising a second electrode pattern for testing on the wafer, wherein the first electrode pattern is different from the second electrode pattern;
forming a plurality of light-emitting elements for commercial use on the wafer, wherein one of the plurality of light-emitting elements comprises the first electrode pattern, another one of the plurality of light-emitting elements comprises the second electrode pattern;
providing a connection structure to permanently and simultaneously connect the plurality of light-emitting elements to each other; and
applying a current flow to the first light-emitting element for testing at least one optoelectrical property of the first light-emitting element or the second light-emitting element while no current flow is applied to the plurality of light-emitting elements.

2. The method according to claim 1, further comprising forming a first pair of conductive pads electrically connected to the first light emitting element; and forming a second pair of conductive pads electrically connected to the second light emitting element.

3. The method according to claim 2, wherein one of the first pair of conductive pads is formed outside the first light emitting element, the other one of the first pair of conductive pads is formed on the first light emitting element.

4. The method according to claim 1, wherein the first light-emitting element comprises substantial the same structure as the one of the plurality of light-emitting elements.

5. The method according to claim 2, wherein the second pair of conductive pads is formed outside the second light emitting element.

6. The method according to claim 1, wherein the second light-emitting element comprises substantial the same structure as the another one of the plurality of light-emitting elements.

7. The method according to claim 2, wherein the wafer comprises one test site where the first light-emitting element and the second light-emitting element are located and one device site where the plurality of light-emitting elements is located.

8. The method according to claim 7, wherein the test site has an area equal to that of the device site.

9. The method according to claim 7, wherein an area of the test site is multiple times of the area of the device site.

10. The method according to claim 7, wherein the wafer further comprises a scribe area having a width separating the test site from the device site.

11. The method according to claim 10, wherein one of the conductive pads has a width larger than the width of the scribe area.

12. The method according to claim 10, wherein one of the conductive pads has a width smaller than the width of the scribe area.

* * * * *